US008847644B2

(12) United States Patent
Kim

(10) Patent No.: US 8,847,644 B2
(45) Date of Patent: Sep. 30, 2014

(54) SEMICONDUCTOR APPARATUS

(71) Applicant: SK hynix Inc., Icheon-si (KR)

(72) Inventor: Kwan Dong Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/860,307

(22) Filed: Apr. 10, 2013

(65) Prior Publication Data

US 2014/0176207 A1  Jun. 26, 2014

(30) Foreign Application Priority Data

Dec. 24, 2012 (KR) ........................ 10-2012-0152193

(51) Int. Cl.
  *H03L 7/06* (2006.01)
  *H03L 7/087* (2006.01)
(52) U.S. Cl.
  CPC ..................................... *H03L 7/087* (2013.01)
  USPC .......................................... 327/158; 327/147
(58) Field of Classification Search
  USPC ................... 327/147–149, 156–158
  See application file for complete search history.

(56) References Cited

U.S. PATENT DOCUMENTS

| 6,247,138 | B1 * | 6/2001 | Tamura et al. ................ 713/600 |
| 6,265,904 | B1 * | 7/2001 | Killorn ........................... 327/12 |
| 6,424,180 | B1 * | 7/2002 | Killorn ........................... 327/12 |
| 6,433,671 | B1 * | 8/2002 | Nysen ........................ 340/10.41 |
| 6,463,392 | B1 * | 10/2002 | Nygaard et al. ................ 702/89 |
| 7,348,823 | B2 * | 3/2008 | Takai et al. .................... 327/291 |
| 7,928,783 | B2 * | 4/2011 | Yun et al. ....................... 327/158 |
| 8,351,283 | B2 * | 1/2013 | Shinozaki et al. ............ 365/194 |
| 8,373,475 | B2 * | 2/2013 | Na et al. ........................ 327/158 |
| 8,548,773 | B2 * | 10/2013 | Shang et al. .................. 702/186 |
| 2003/0201810 | A1 * | 10/2003 | Kim et al. ....................... 327/170 |
| 2004/0183613 | A1 * | 9/2004 | Kurd et al. ...................... 331/186 |
| 2005/0024107 | A1 * | 2/2005 | Takai et al. .................... 327/158 |
| 2005/0190875 | A1 * | 9/2005 | Feiereisel et al. ............. 375/356 |
| 2006/0029175 | A1 * | 2/2006 | Schnarr ......................... 375/376 |
| 2007/0030040 | A1 * | 2/2007 | Takai et al. .................... 327/156 |
| 2009/0195281 | A1 * | 8/2009 | Tamura et al. ................. 327/163 |
| 2010/0142660 | A1 * | 6/2010 | Schnarr ......................... 375/344 |
| 2010/0322022 | A1 * | 12/2010 | Shinozaki et al. ............ 365/194 |
| 2010/0327926 | A1 * | 12/2010 | Takahashi ..................... 327/158 |
| 2010/0329040 | A1 * | 12/2010 | Jeong et al. ............. 365/189.05 |
| 2011/0084744 | A1 * | 4/2011 | Nishioka et al. .............. 327/161 |

(Continued)

FOREIGN PATENT DOCUMENTS

| KR | 1020070107976 A | 11/2007 |
| KR | 1020090036414 A | 4/2009 |

*Primary Examiner* — Adam Houston
(74) *Attorney, Agent, or Firm* — Willam Park & Associates Patent Ltd.

(57) ABSTRACT

A semiconductor apparatus includes: a variable delay unit configured to delay a reference clock signal in response to a delay code and generate a data latch clock signal; a delay amount control unit configured to convert a phase of external data and a phase of the data latch clock signal into first and second codes, respectively, and generate the delay code through a calculation of the first and second codes; and a data receiver configured to latch the external data as internal data in synchronization with the data latch clock signal.

20 Claims, 6 Drawing Sheets

(56) References Cited

U.S. PATENT DOCUMENTS

| | | |
|---|---|---|
| 2012/0086486 A1* | 4/2012 | Na et al. ......................... 327/158 |
| 2012/0140869 A1* | 6/2012 | Choi ................................. 377/2 |
| 2013/0010515 A1* | 1/2013 | Nishioka et al. ................ 365/51 |
| 2013/0254434 A1* | 9/2013 | Fujioka et al. .................. 710/22 |
| 2014/0002155 A1* | 1/2014 | Park et al. ...................... 327/158 |
| 2014/0016388 A1* | 1/2014 | Nishioka et al. ................ 365/51 |
| 2014/0056086 A1* | 2/2014 | Yoko et al. ..................... 365/191 |
| 2014/0118040 A1* | 5/2014 | Nakayama et al. ........... 327/157 |

* cited by examiner

SEMICONDUCTOR APPARATUS

CROSS-REFERENCES TO RELATED APPLICATION

The present application claims priority under 35 U.S.C. §119(a) to Korean application number 10-2012-0152193 filed on Dec. 24, 2012 in the Korean Intellectual Property Office, which is incorporated herein by reference in its entirety.

BACKGROUND

1. Technical Field

Various embodiments generally relate to a semiconductor apparatus, and more particularly, to data reception of a semiconductor apparatus.

2. Related Art

A semiconductor apparatus includes a data receiver to receive data from outside. The semiconductor apparatus operates in synchronization with a clock signal in order to operation at high speed, and the data receiver also latches data applied from outside in synchronization with the clock signal.

FIG. 1 is a diagram illustrating a data receiver of a conventional semiconductor apparatus.

The data receiver 2 latches external data DATA applied through a data input/output pad 1 as internal data DATA_RX in synchronization with a data latch clock signal CLKOUT.

Recently, a DDR (Double Data Rate) synchronous semiconductor apparatus has been used to further improve operation speed. When the DDR synchronous semiconductor apparatus is used, data is latched even at a falling edge as well as a rising edge of a clock signal. According to the DDR synchronous semiconductor apparatus, the data receiver 2 may receive data quickly by latching external data DATA at a falling edge as well as a rising edge of a data latch clock signal CLKOUT.

Additionally, in order for the semiconductor apparatus to normally operate, the external data DATA must be precisely latched. For this operation, the phase of the data latch clock signal CLKOUT must be controlled to precisely latch data.

SUMMARY

In an embodiment, a semiconductor apparatus includes: a variable delay unit configured to delay a reference clock signal in response to a delay code and generate a data latch clock signal; a delay amount control unit configured to convert a phase of external data and a phase of the data latch clock signal into first and second codes, respectively, and generate the delay code through a calculation of the first and second codes; and a data receiver configured to latch the external data as internal data in synchronization with the data latch clock signal.

In an embodiment, a semiconductor apparatus includes: a first converter configured to generate a phase of external data as a first code; a second converter configured to generate a phase of a data latch clock signal as a second code; a calculator configured to calculate a difference between the first and second codes and generate a delay code; and a variable delay unit configured to delay a reference clock signal in response to the delay code and generate the data latch clock signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through various embodiments.

Figure 1:
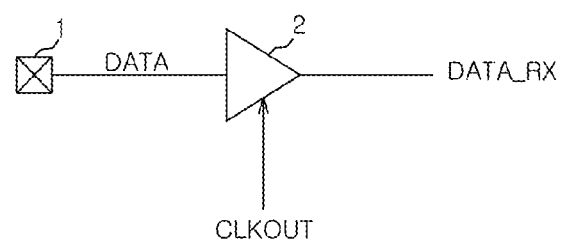
FIG. 1 is a diagram illustrating a data receiver of a conventional semiconductor apparatus.
Figure 2:
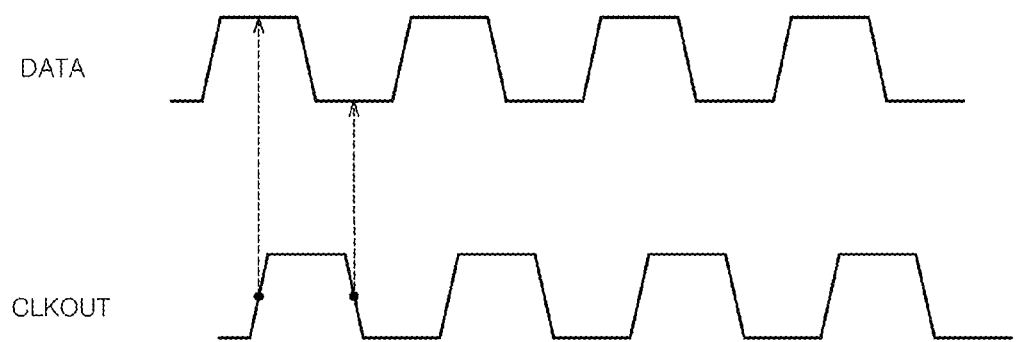
FIG. 2 is a waveform data illustrating the relationship between ideal data and a data latch clock signal.

FIG. 2 is a waveform data illustrating the relationship between ideal data and a data latch clock signal.

In order for a DDR system to normally latch external data DATA in synchronization with a data latch clock signal CLKOUT without an error, the external data DATA must stably maintain its value at a rising edge or falling edge of the data latch clock signal CLKOUT. That is, when the external data DATA and the data latch clock signal CLKOUT have a phase difference of 90 degrees, the external data DATA may be precisely latched.

FIG. 2 illustrates a case in which the phase of the data latch clock signal CLKOUT lags the external data DATA by substantially 90 degrees. As illustrated in FIG. 2, when the external data DATA is continuously applied as 101010, the external data DATA may be latched as 1 at a rising edge of the data latch clock signal CLKOUT, and latched as 0 at a falling edge of the data latch clock signal CLKOUT.

Figure 3:
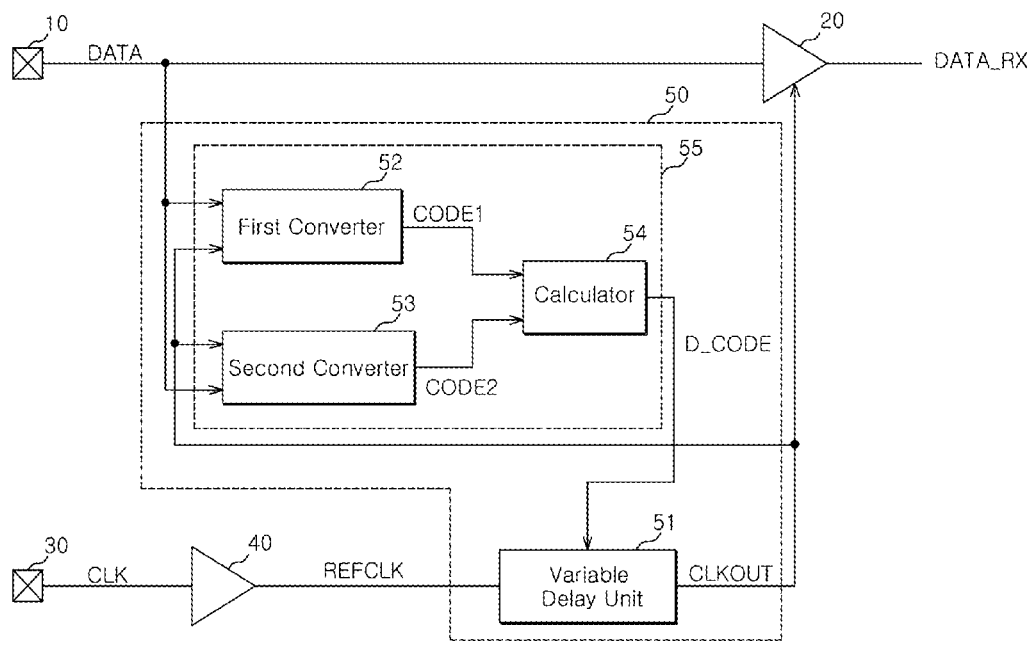
FIG. 3 is a block diagram of a semiconductor apparatus according to an embodiment of the present invention.

FIG. 3 is a block diagram of a semiconductor apparatus according to an embodiment of the present invention.

The semiconductor apparatus of FIG. 3 may include a data input/output pad 10, a data receiver 20, a clock input pad 30, a clock receiver 40, and a data latch clock generator 50.

The data input/output pad 10 may be configured to receive external data DATA from outside.

The data receiver 20 may be configured to latch the received external data DATA in synchronization with a data latch clock signal CLKOUT and output the latched data as internal data DATA_RX.

The clock input pad 30 may be configured to receive an external clock signal CLK from outside.

The clock receiver 40 may be configured to receive the received external clock signal CLK and output the received signal as a reference clock signal REFCLK.

The data latch clock generator 50 may be configured to control a delay amount of the reference clock signal REFCLK and generate a data latch clock signal CLKOUT. Desirably, the data latch clock generator 50 may control the delay amount of the reference clock signal REFCLK such that the external data DATA and the data latch clock signal CLKOUT have a phase difference of 90 degrees.

Specifically, the data latch clock generator 50 may include a variable delay unit 51 and a delay control unit 55.

The variable delay unit 51 may be configured to delay a reference clock signal REFCLK in response to a delay code D_CODE and generate the data latch clock signal CLKOUT.

The delay amount control unit 55 may be configured to convert the phase of the external data DATA and the phase of the data latch clock signal CLKOUT into codes, and perform a calculation on the codes so as to generate the delay code D_CODE. Depending on the calculation result, the value of the delay code D_CODE is changed. Accordingly, the delay amount of the variable delay unit 51 is controlled.

Specifically, the delay amount control unit 55 may include a first converter 52, a second converter 53, and a calculator 54.

The first and second converters 53 and 54 are configured to convert the phase of the external data DATA and the phase of the data latch clock signal CLKOUT into the respective codes, and the calculator 54 may be configured to perform a calculation on the codes in a digital manner and generate the delay code D_CODE. Owing to the digital operation, the data latch clock generator according to the embodiments of the present invention may operate at high speed and with precision.

Specifically, the first converter 52 generates the phase of the external data DATA as a first code CODE1. Although described below, the first converter 52 generates a rising time point of the external data DATA before a rising time point of the data latch clock signal CLKOUT as the first code CODE1, based on the rising time point of the data latch clock signal CLKOUT.

The second converter 53 generates the phase of the data latch clock signal CLKOUT as a second code CODE2. Although described below, the second converter 53 generates a rising time point of the data latch clock signal CLKOUT before a rising time point of inverted external data DATA as the second code CODE2, based on the rising time point of the inverted external data DATA.

The calculator 54 generates the delay code D_CODE based on a difference between the first and second codes CODE1 and CODE2.

For example, when the external data DATA and the data latch clock signal CLKOUT have a phase difference of 0 to 90 degrees, the calculator 54 increases the delay code D_CODE. On the other hand, when the external data DATA and the data latch clock signal CLKOUT have a phase difference of 90 to 180 degrees, the calculator 54 decreases the delay code D_CODE. When the delay code D_CODE is increased, the delay amount of the variable delay unit 51 is increased, and when the delay code D_CODE is decreased, the delay amount of the variable delay unit 51 is decreased.

Figure 4:
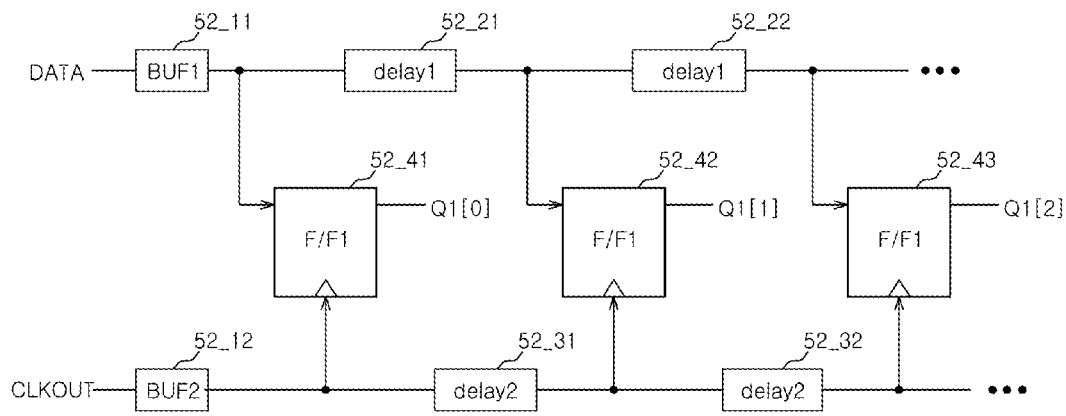
FIG. 4 is a circuit diagram illustrating an embodiment of a first converter of FIG. 3.

FIG. 4 is a circuit diagram illustrating an embodiment of the first converter 52.

The first converter 52 uses the data latch clock signal CLKOUT to convert the phase of the external data DATA into the first code CODE1. The first converter 52 latches the external data DATA using the data latch clock signal CLKOUT, and thus converts the phase of the external data DATA into a first latch code Q1[0] to Q1[2].

Specifically, the first converter 52 may include first and second buffers 52_11 and 52_12, a plurality of first delays 52_21 and 52_22, a plurality of second delays 52_31 and 52_32, and a plurality of first flip-flops 52_41 to 52_43.

The first buffer 52_11 may be configured to buffer the external data DATA and output the buffered data.

The second buffer 52_12 may be configured to receive the data latch clock signal CLKOUT and buffer the data latch clock signal CLKOUT by the same amount as a delay amount of the first buffer 52_11. The second buffer 52_11 serves to compensate for the delay amount caused by the first buffer 52_11.

The plurality of first delays 52_21 and 52_22 are configured to sequentially delay the external data DATA by a first delay amount.

The plurality of second delays 52_31 and 52_32 are configured to sequentially delay the data latch clock signal CLKOUT by a second delay amount.

Additionally, the first delay amount may be set to be larger than the second delay amount.

The plurality of first flip-flops 52_41 to 52_43 are configured to latch the external data DATA and outputs of the first delays 52_21 and 52_22 in response to the data latch clock signal CLKOUT and outputs of the second delays 52_31 and 52_32, respectively, and output the latch results as the respective bits of the first latch code Q1[0] to Q1[2]. That is, the plurality of first flop-flops 52_41 to 52_43 delay the external data DATA by a predetermined phase based on the data latch clock signal CLKOUT, and output the level of the external data DATA as the first latch code Q1[0] to Q1[2]. Therefore, the phase information of the external data DATA is reflected into the first latch code Q1[0] to Q1[2].

The data latch clock generator 50 is locked when the external data DATA and the data latch clock signal CLKOUT have a phase difference of substantially 90 degrees. When the phase of the data latch clock signal CLKOUT is positioned between 0 and 90 degrees from the phase of the external data DATA, the first latch code Q1[0] to Q1[2] may be generated as 11000000 from the most significant bit in case where the first latch code Q1[0] to Q1[2] has eight bits, for example. In this case, suppose that the signals are latched in a state where one period of the reference clock signal REFCLK is divided by eight. Additionally, a time point at which the first latch code Q1[0] to Q1[2] transits from 1 to 0 corresponds to a rising time point of the external data DATA just before a rising time point of the data latch clock signal CLKOUT. That is, the phase information until the data latch clock signal CLKOUT rises after the external data DATA rises is reflected. The first converter 52 decides the magnitude of the first code CODE1 based on the time point at which the level of the first latch code Q1[0] to Q1[2] transits from 1 to 0. In these embodiments of the present invention, the first code CODE1 may have a magnitude of 2.

On the other hand, when the phase of the data latch clock signal CLKOUT is positioned between 90 and 180 degrees from the phase of the external data DATA, the first latch code Q1[0] to Q1[2] may be generated as 11111100 from the most significant bit in case where the first latch code Q1[0] to Q1[2] has eight bits, for example. Additionally, a time point at which the first latch code Q1[0] to Q1[2] transits from 1 to 0 corresponds to a rising time point of the external data DATA just before a rising time point of the data latch clock signal CLKOUT. That is, the phase information until the data latch clock signal CLKOUT rises after the external data DATA rises is reflected. The first converter 52 decides the magnitude of the first code CODE1 based on a time point at which the level of the first latch code Q1[0] to Q1[2] transits from 1 to 0. In these embodiments of the present invention, the first code CODE1 may have a magnitude of 6.

Figure 5:
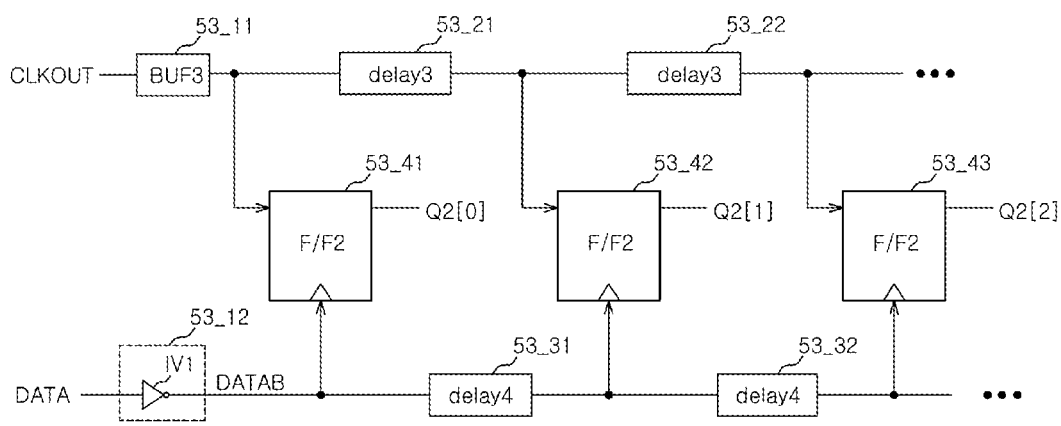
FIG. 5 is a circuit diagram illustrating an embodiment of a second converter of FIG. 3.

FIG. 5 is a circuit diagram illustrating an embodiment of the second converter 53.

The second converter 53 uses the inverted external data DATAB to convert the phase of the data latch clock signal CLKOUT into the second code CODE2. The second converter 53 latches the data latch clock signal CLKOUT using the inverted external data DATAB, and thus converts the phase of the data latch clock signal CLKOUT into a second latch code Q2[0] to Q2[2].

Specifically, the second converter 53 may include a third buffer 53_11, an inverter (IV1) 53_12, a plurality of third delays 53_21 and 53_22, a plurality of fourth delays 53_31 and 53_32, and a plurality of first flip-flops 53_41 to 53_43.

The inverter 53_12 may be configured to receive the external data DATA and generate the inverted external data DATAB.

The third buffer 53_11 may be configured to receive the data latch clock signal CLKOUT and delay the data latch clock signal CLKOUT by the same amount as a delay amount of the inverter 52_12. The third buffer 53_12 serves to compensate for the delay amount caused by the inverter 53_12.

The plurality of third delays 53_21 and 53_22 are configured to sequentially delay the data latch clock signal CLKOUT by a third delay amount.

The plurality of fourth delays 53_31 and 53_32 are configured to sequentially delay the inverted external data DATAB by a fourth delay amount.

Additionally, the third delay amount may be set to be larger than the fourth delay amount and set to be equal to the first delay amount, and the fourth delay amount may be set to be equal to the second delay amount.

The plurality of second flip-flops 53_41 to 53_43 are configured to latch the data latch clock signal CLKOUT and outputs of the first delays 52_21 and 52_22 in response to the inverted external data DATAB and outputs of the fourth delays 53_31 and 53_32, respectively, and output the latch results as the respective bits of the second latch code Q2[0] to Q2[2]. That is, the plurality of second flop-flops 53_41 to 53_43 delay the data latch clock signal CLKOUT by a predetermined phase based on the inverted external data DATAB, and output the level of the inverted external data DATAB as the second latch code Q2[0] to Q2[2]. Therefore, the phase information of the data latch clock signal is reflected into the second latch code Q2[0] to Q2[2].

When the phase of the data latch clock signal CLKOUT is positioned between 0 and 90 degrees from the phase of the external data DATA, the second latch code Q2[0] to Q2[2] may be generated as 11111100 from the most significant bit in case where the second latch code Q2[0] to Q2[2] has eight bits, for example. In this case, suppose that the signals are latched in a state where one period of the reference clock signal REFCLK is divided by eight. Additionally, a time point at which the second latch code Q2[0] to Q2[2] transits from 1 to 0 corresponds to a rising time point of the data latch clock signal CLKOUT just before a rising time point of the inverted external data DATAB. That is, the phase information until the external data DATA falls after the data latch clock signal CLKOUT rises is reflected. The second converter 53 decides the magnitude of the second code CODE2 based on the time point at which the level of the second latch code Q2[0] to Q2[2] transits from 1 to 0. In these embodiments of the present invention, the second code CODE2 may have a magnitude of 6.

On the other hand, when the phase of the data latch clock signal CLKOUT is positioned between 90 and 180 degrees from the phase of the external data DATA, the second latch code Q2[0] to Q2[2] may be generated as 11000000 from the most significant bit in case where the second latch code Q2[0] to Q2[2] has eight bits, for example. Additionally, a time point at which the second latch code Q2[0] to Q2[2] transits from 1 to 0 corresponds to a rising time point of the data latch clock signal CLKOUT just before a rising time point of the inverted external data DATAB. That is, the phase information until the external data DATA falls after the data latch clock signal CLKOUT rises is reflected. The second converter 53 decides the magnitude of the second code CODE2 based on a time point at which the level of the second latch code Q2[0] to Q2[2] transits from 1 to 0. In these embodiments of the present invention, the second code CODE2 may have a magnitude of 2.

Additionally, when the external data DATA and the data latch clock signal CLKOUT have a phase difference of substantially 90 degrees, the first and second codes CODE1 and CODE2 are equalized to each other.

Figure 6:
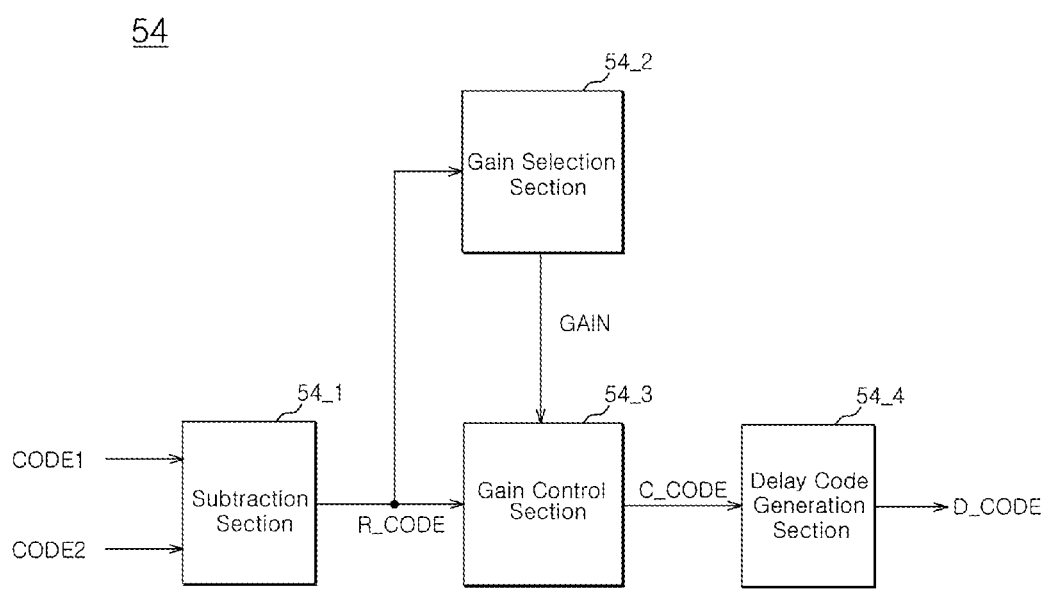
FIG. 6 is a block diagram illustrating an embodiment of a calculator of FIG. 3.

FIG. 6 is a block diagram illustrating an embodiment of the calculator 54.

The calculator 54 may include a subtraction section 54_1, a gain control section 54_3, and a delay code generation section 54_4.

The subtraction section 54_1 may be configured to perform a subtraction on the first and second codes CODE1 and CODE2 and generate a subtraction result code R_CODE. For example, the subtraction section 54_1 may subtract the first code CODE1 from the second code CODE2 to generate the subtraction result code R_CODE.

For example, when the phase of the data latch clock signal CLKOUT is positioned between 0 and 90 degrees from the phase of the external data DATA, the subtraction section 54_1 generates the positive (+) subtraction result code R_CODE. On the other hand, when the phase of the data latch clock signal CLKOUT is positioned between 90 and 180 degrees from the phase of the external data DATA, the subtraction section 54_1 generates the negative (−) subtraction result code R_CODE. The phase difference between the data latch clock signal CLKOUT and the external data DATA is reflected into the magnitude of the subtraction result code R_CODE.

The gain control section 54_3 may be configured to multiply the subtraction result code R_CODE by a gain value GAIN and output the multiplication result as a calculation code C_CODE. The gain value GAIN is a variable for selecting whether to control the delay amount of the variable delay unit 51 by a relatively large unit or a relatively small unit. The gain control section 54_3 multiplies the subtraction result code R_CODE by the preset gain value GAIN so as to control the magnitude of the calculation code C_CODE.

The delay code generation section 54_4 may be configured to generate the delay code D_CODE in response to the calculation code C_CODE. The delay code generation section 54_4 may have a feedback loop structure, for example. That is, the delay code generation section 54_4 stores an existing delay code D_CODE, and adds the calculation code C_CODE to the stored delay code D_CODE so as to generate a new delay code D_CODE. The new delay code D_CODE is stored in the delay code generation section 54_4. Such a process is performed until the data latch clock generator is locked.

Specifically, when the calculation code C_CODE having a positive value is applied, the delay code D_CODE is increased. According to the magnitude of the calculation code C_CODE, the increase of the delay code D_CODE is determined.

On the other hand, when the calculation code C_CODE having a negative value is applied, the delay code D_CODE is decreased. According to the magnitude of the calculation code C_CODE, the decrease of the delay code D_CODE is determined.

The calculator 54 may further include a gain selection section 54_2 to select the gain value GAIN.

The gain selection section 54_2 may be configured to receive the subtraction result code R_CODE, and select a gain value GAIN according to the magnitude of the subtraction result code R_CODE. That is, when the subtraction result code R_CODE has a large magnitude, it means that the data latch clock signal CLKOUT and the external data DATA have a large phase difference. Therefore, the gain selection section 54_2 selects and outputs a larger gain value GAIN. On the other hand, when the subtraction result code R_CODE has a small magnitude, it means that the data latch clock signal CLKOUT and the external data DATA have a small phase difference. Therefore, the gain selection section 54_2 selects and outputs a smaller gain value GAIN, in order to minutely control the delay amount.

Figure 7:
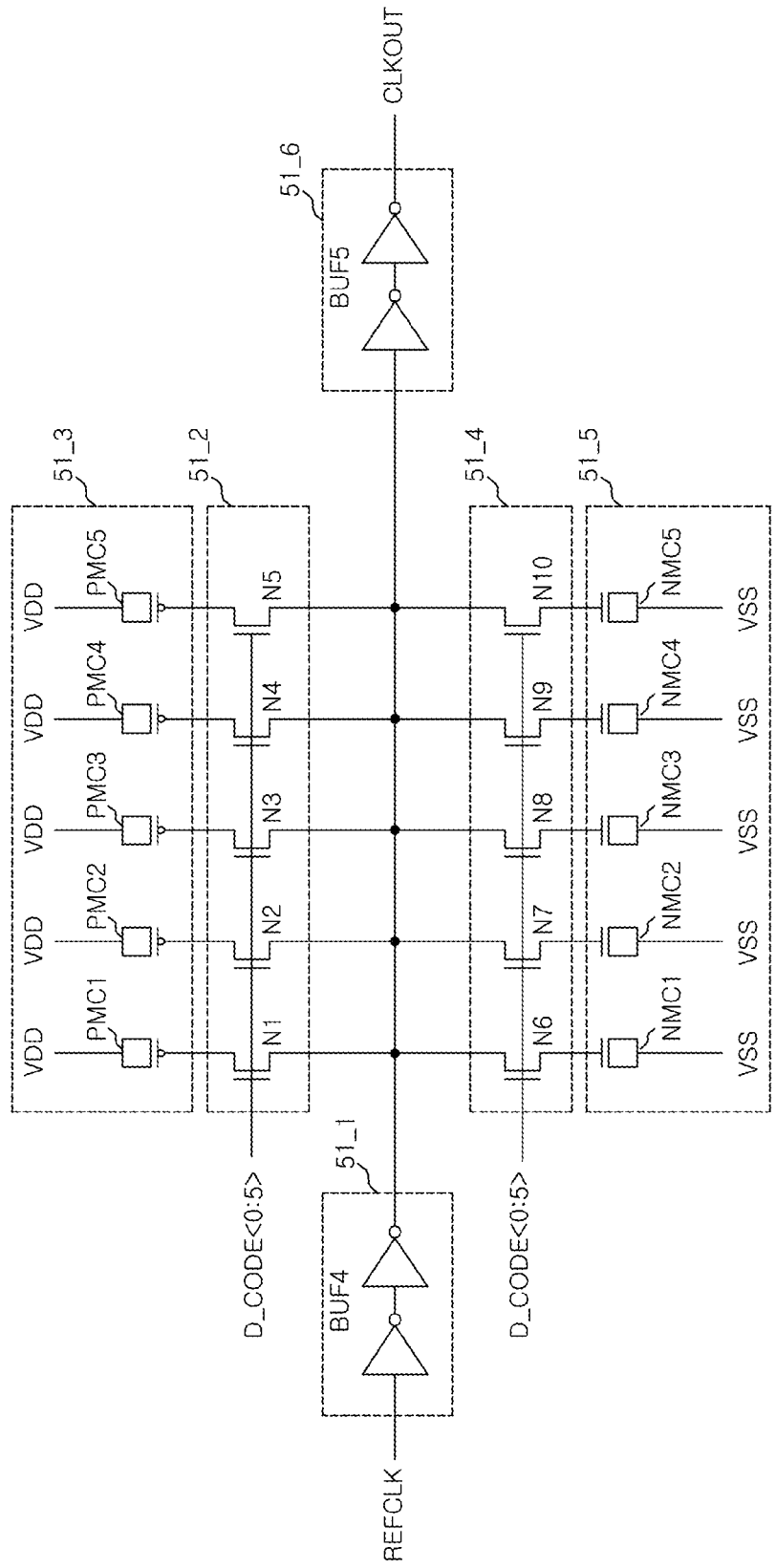
FIG. 7 is a circuit diagram illustrating an embodiment of a variable delay unit of FIG. 3.

FIG. 7 is a circuit diagram illustrating an embodiment of the variable delay unit 51.

The variable delay unit 51 may include a first clock buffer 51_1, a first delay selection section 51_2, a first loading section 51_3, a second delay selection section 51_4, a second loading section 51_5, and a second clock buffer 51_6.

The first clock buffer 51_1 may include a fourth buffer BUF4 configured to buffer the reference clock signal REFCLK.

The first delay selection section 51_2 may include first to fifth NMOS transistors N1 to N5 configured to be turned on in response to the respective bits of the delay code D_CODE<0:5>.

The first loading section 51_3 may include first to fifth PMOS capacitors PMC1 to PMC5 configured to receive an external voltage VDD and increase loading of an output terminal of the first clock buffer 51_1.

The second delay selection section 51_4 may include sixth to tenth NMOS transistors N6 to N10 configured to be turned on in response to the respective bits of the delay code D_CODE<0:5>.

The second loading section 51_5 may include first to fifth NMOS capacitors NMC1 to NMC5 configured to receive a ground voltage VSS and increase loading of the output terminal of the first clock buffer 51_1.

The second clock buffer 51_6 may include a fifth buffer BUF5 configured to buffer an output of the first clock buffer 51_1.

In these embodiments of the present invention, the delay code D_CODE<0:5> is set to have five bits. However, the present invention is not limited thereto, which is obvious to those skilled in the art.

In the variable delay unit 51 according to the embodiments of the present invention, when the delay code DCODE<0:5> is increased, the number of transistors turned on in the first and second delay selection sections 51_3 and 51_4 increases. Therefore, the output loading of the first clock buffer 51_1 is increased by the influence of the first and second loading sections 51_3 and 51_5. As a result, the delay amount of the data latch clock signal CLKOUT is increased.

On the other hand, when the delay code DCODE<0:5> is decreased, the number of transistors tuned on in the first and second delay selection sections 51_2 and 51_4 decreases. Therefore, the influence of the first and second loading sections 51_3 and 51_5 is reduced to decrease the output loading of the first clock buffer 51_1. As a result, the delay amount of the data latch clock signal CLKOUT is decreased.

Figure 8:
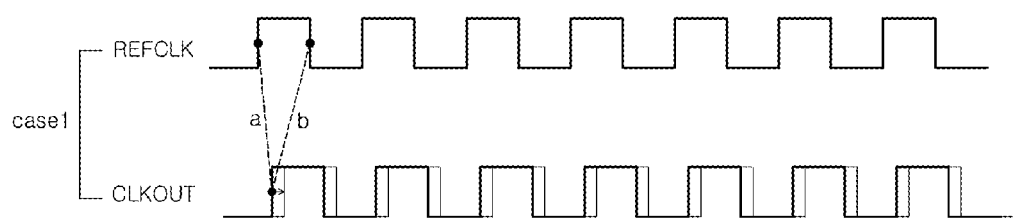
FIG. 8 is a waveform diagram illustrating the operation of the semiconductor apparatus according to the embodiments of the present invention.
Figure 8:
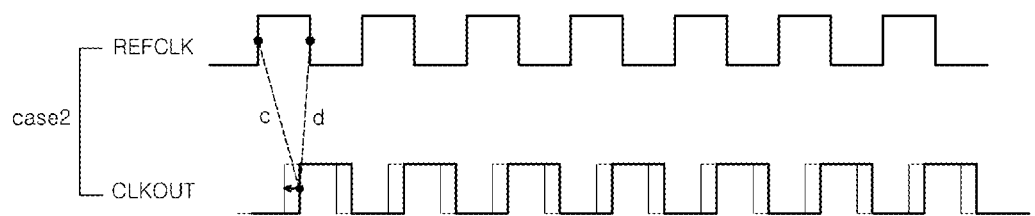

FIG. 8 is a waveform diagram illustrating the operation of the semiconductor apparatus according to the embodiments of the present invention.

A first case case1 illustrates a case in which the phase of the data latch clock signal CLKOUT is positioned between 0 and 90 degrees from the phase of the external data DATA. The first code CODE1 corresponding to a period a is generated, and the second code CODE2 corresponding to a period b is generated. In these embodiments of the present invention, since the positive calculation code C_CODE is generated, the variable delay unit 51 increases the delay amount of the reference clock signal REFCLK. Thus, the phase of the data latch clock signal CLKOUT is moved backward.

A second case case2 illustrates a case in which the phase of the data latch clock signal CLKOUT is positioned between 90 and 180 degrees from the phase of the external data DATA. The first code CODE1 corresponding to a period c is generated, and the second code CODE2 corresponding to a period d is generated. In these embodiments of the present invention, since the negative calculation code C_CODE is generated, the variable delay unit 51 decreases the delay amount of the reference clock signal REFCLK. Thus, the phase of the data latch clock signal CLKOUT is moved forward.

When the data latch clock signal CLKOUT and the external data DATA have a phase difference of 90 degrees, the first and second codes CODE1 and CODE2 are equalized to each other, and the variable delay unit 51 is locked.

While various embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    a variable delay unit configured to delay a reference clock signal in response to a delay code and generate a data latch clock signal;
    a delay amount control unit configured to convert a phase of external data and a phase of the data latch clock signal into first and second codes, respectively, and generate the delay code through a calculation of the first and second codes; and
    a data receiver configured to latch the external data as internal data in synchronization with the data latch clock signal.

2. The semiconductor apparatus according to claim 1, wherein the delay amount control unit comprises:
    a first converter configured to generate the phase of the external data as the first code;
    a second converter configured to generate the phase of the data latch clock signal as the second code; and
    a calculator configured to calculate a difference between the first and second codes and generate a delay code.

3. The semiconductor apparatus according to claim 2, wherein the first converter generates a rising time point of the external data before a rising time point of the data latch clock signal as the first code, based on the rising time point of the data latch clock signal.

4. The semiconductor apparatus according to claim 2, wherein the first converter comprises:
    a plurality of first delays configured to sequentially delay the external data by a first delay amount;
    a plurality of second delays configured to sequentially delay the data latch clock signal by a second delay amount; and
    a plurality of first flip-flops configured to sequentially latch outputs of the first delays according to outputs of the second delays, respectively, and generate a first latch code.

5. The semiconductor apparatus according to claim 4, wherein the first delay amount is set to be larger than the second delay amount.

6. The semiconductor apparatus according to claim 4, wherein the first converter converts the first latch code into the first code.

7. The semiconductor apparatus according to claim 2, wherein the second converter generates a rising time point of the data latch clock signal before a rising time point of inverted external data as the second code, based on the rising time point of the inverted external data.

8. The semiconductor apparatus according to claim 2, wherein the second converter comprises:
   a plurality of third delays configured to sequentially delay the data latch clock signal by a third delay amount;
   a plurality of fourth delays configured to sequentially delay inverted external data by a fourth delay amount; and
   a plurality of second flip-flops configured to sequentially latch outputs of the third delays according to outputs of the fourth delays, respectively, and generate a second latch code.

9. The semiconductor apparatus according to claim 8, wherein the third delay amount is set to be larger than the fourth delay amount.

10. The semiconductor apparatus according to claim 8, wherein the second converter converts the second latch code into the second code.

11. The semiconductor apparatus according to claim 2, wherein the calculator comprises:
   a subtraction section configured to perform a subtraction on the first and second codes and generate a subtraction result code;
   a gain control section configured to multiply the subtraction result code by a gain value and output the multiplication result as the calculation code; and
   a delay code generation section configured to adjust the delay code in response to the calculation code.

12. The semiconductor apparatus according to claim 11, wherein the calculator further comprises a gain selection section configured to adjust the gain value in response to the subtraction result code.

13. The semiconductor apparatus according to claim 2, wherein the first and second converters generate the first and second codes equal to each other, when the external data and the data latch clock signal have a phase difference of substantially 90 degrees, and
   the variable delay unit is locked when the first and second codes are equal to each other.

14. A semiconductor apparatus comprising:
   a first converter configured to generate a phase of external data as a first code;
   a second converter configured to generate a phase of a data latch clock signal as a second code;
   a calculator configured to calculate a difference between the first and second codes and generate a delay code; and
   a variable delay unit configured to delay a reference clock signal in response to the delay code and generate the data latch clock signal.

15. The semiconductor apparatus according to claim 14, wherein the first converter generates a rising time point of the external data before a rising time point of the data latch clock signal as the first code, based on the rising time point of the data latch clock signal.

16. The semiconductor apparatus according to claim 14, wherein the first converter comprises:
   a plurality of first delays configured to sequentially delay the external data by a first delay amount;
   a plurality of second delays configured to sequentially delay the data latch clock signal by a second delay amount; and
   a plurality of first flip-flops configured to sequentially latch outputs of the first delays according to outputs of the second delays, respectively, and generate a first latch code.

17. The semiconductor apparatus according to claim 16, wherein the first delay amount is set to be larger than the second delay amount, and
   the first converter converts the first latch code into the first code.

18. The semiconductor apparatus according to claim 14, wherein the second converter generates a rising time point of the data latch clock signal before a rising time point of inverted external data as the second code, based on the rising time point of the inverted external data.

19. The semiconductor apparatus according to claim 14, wherein the second converter comprises:
   a plurality of third delays configured to sequentially delay the data latch clock signal by a third delay amount;
   a plurality of fourth delays configured to sequentially delay inverted external data by a fourth delay amount; and
   a plurality of second flip-flops configured to sequentially latch outputs of the third delays according to outputs of the fourth delays, respectively, and generate a second latch code.

20. The semiconductor apparatus according to claim 19, wherein the third delay amount is set to be larger than the fourth delay amount, and
   the second converter converts the second latch code into the second code.

* * * * *